(12) United States Patent
Kang

(10) Patent No.: US 10,546,984 B2
(45) Date of Patent: Jan. 28, 2020

(54) LENS AND LIGHT EMISSION UNIT INCLUDING THE SAME

(71) Applicant: LG INNOTEK CO., LTD., Seoul (KR)

(72) Inventor: Sung Ku Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 55 days.

(21) Appl. No.: 15/751,788

(22) PCT Filed: Jul. 25, 2016

(86) PCT No.: PCT/KR2016/008094
§ 371 (c)(1),
(2) Date: Feb. 9, 2018

(87) PCT Pub. No.: WO2017/026699
PCT Pub. Date: Feb. 16, 2017

(65) Prior Publication Data
US 2018/0240949 A1 Aug. 23, 2018

(30) Foreign Application Priority Data
Aug. 11, 2015 (KR) .......................... 10-2015-0112895

(51) Int. Cl.
*F21V 3/00* (2015.01)
*F21V 5/00* (2018.01)
*H01L 33/60* (2010.01)
*F21K 9/23* (2016.01)
*H01S 5/022* (2006.01)

(52) U.S. Cl.
CPC ................ *H01L 33/60* (2013.01); *F21K 9/23* (2016.08); *H01S 5/02288* (2013.01)

(58) Field of Classification Search
CPC ..... F21K 9/20; F21K 9/23; F21V 5/02; F21V 5/045; G02B 3/08; G02B 19/0009; G02B 19/0014; G02B 19/0061; H01L 33/58; H01L 33/60; H01S 5/02288; H01S 5/02292
USPC .............................. 362/311.02, 800; 257/98
See application file for complete search history.

(56) References Cited

FOREIGN PATENT DOCUMENTS

| EP | 2 711 615 A1 | 3/2014 |
|---|---|---|
| JP | 2009-245681 A | 10/2009 |
| JP | 2012-99320 A | 5/2012 |
| JP | 2015-88347 A | 5/2015 |
| KR | 10-2010-0119603 A | 11/2010 |
| KR | 10-2012-0003084 A | 1/2012 |
| KR | 10-1177760 B1 | 8/2012 |
| KR | 10-2016-0069671 A | 6/2016 |

*Primary Examiner* — Jason M Han
(74) *Attorney, Agent, or Firm* — Birch, Stewart, Kolasch & Birch, LLP

(57) ABSTRACT

An embodiment provides a lens comprising: a lens body; a groove placed on one side of the lens body; a plurality of light path conversion units arranged on a first area of the surface of the lens body, opposite to the groove; and a plurality of refraction units arranged on a second area of the surface of the lens body, opposite to the groove, wherein the first area and the second area are arranged opposite to each other with respect to the center of the surface of the lens body.

19 Claims, 6 Drawing Sheets

【FIG. 1】
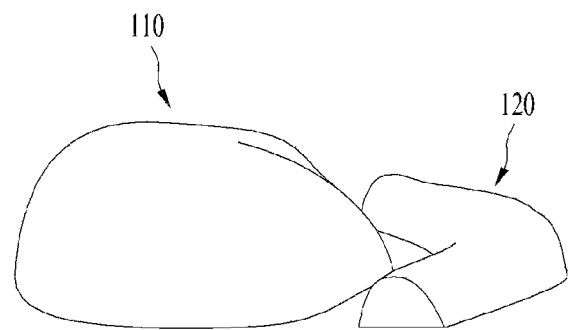
【FIG. 2a】
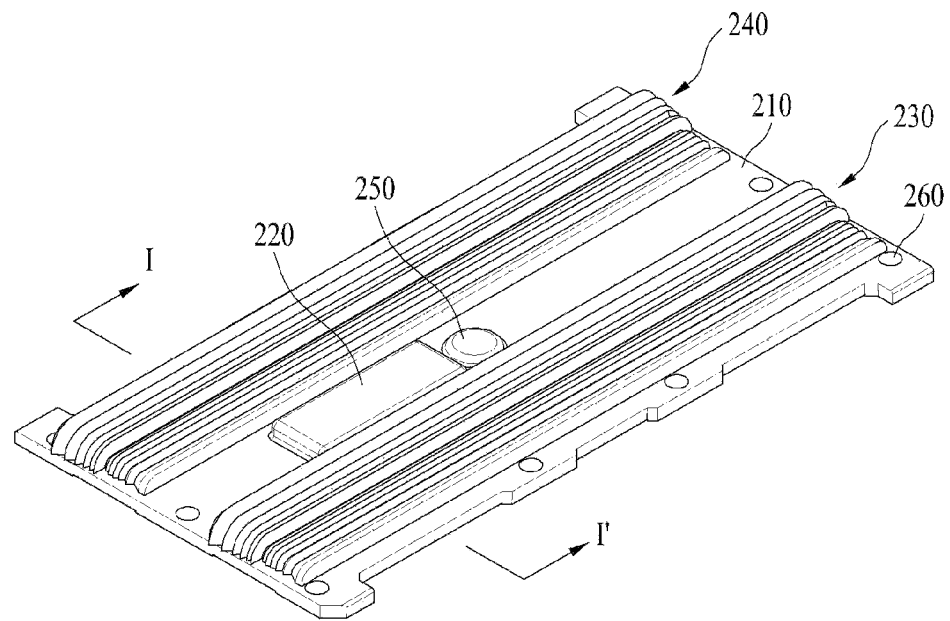

【FIG. 2b】
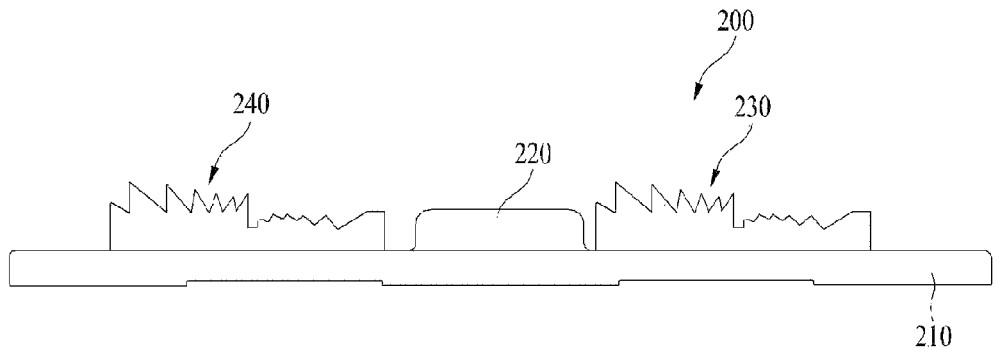
【FIG. 3】
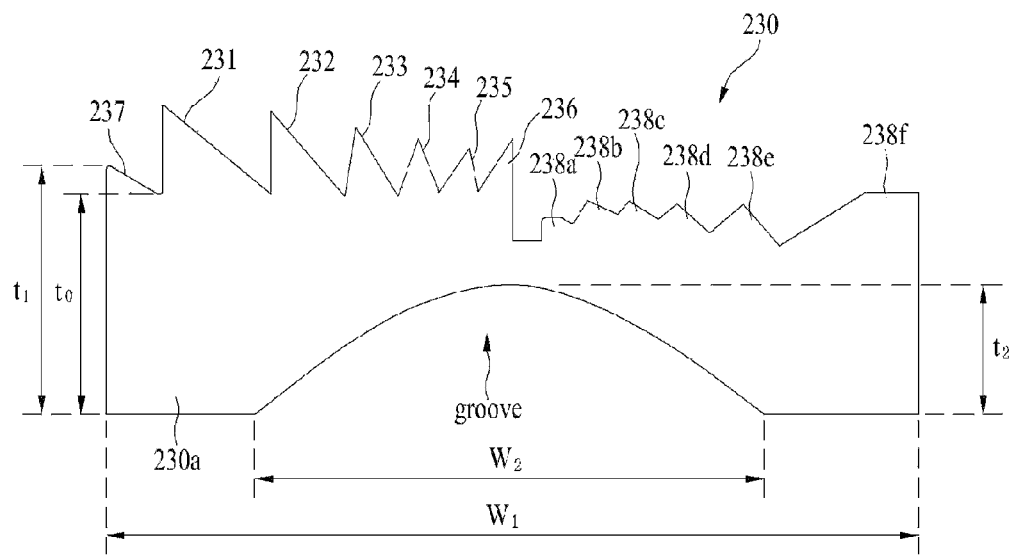
【FIG. 4a】
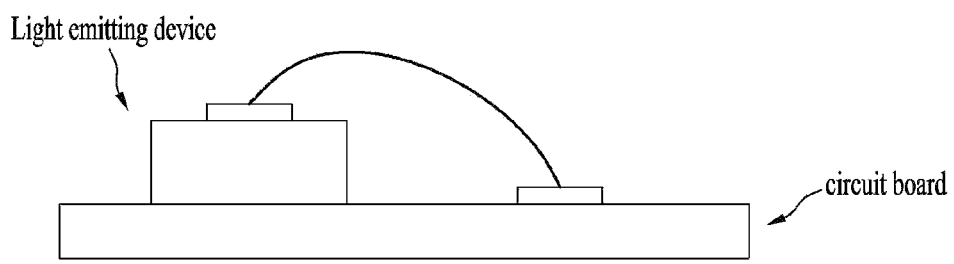

[FIG. 4b]
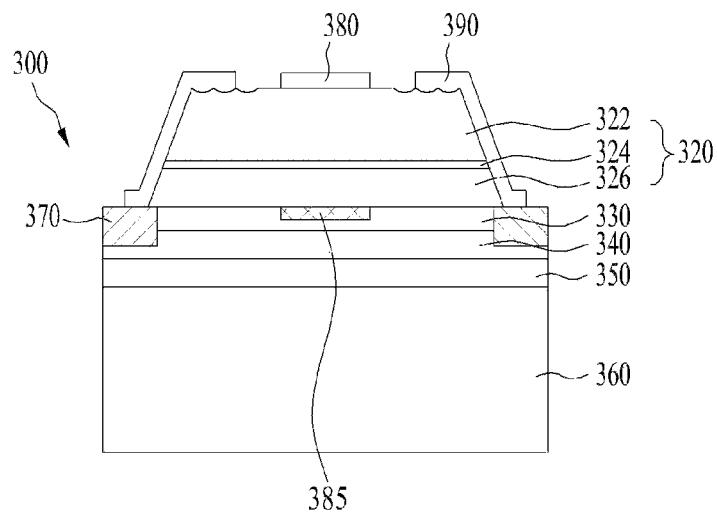
[FIG. 5a]
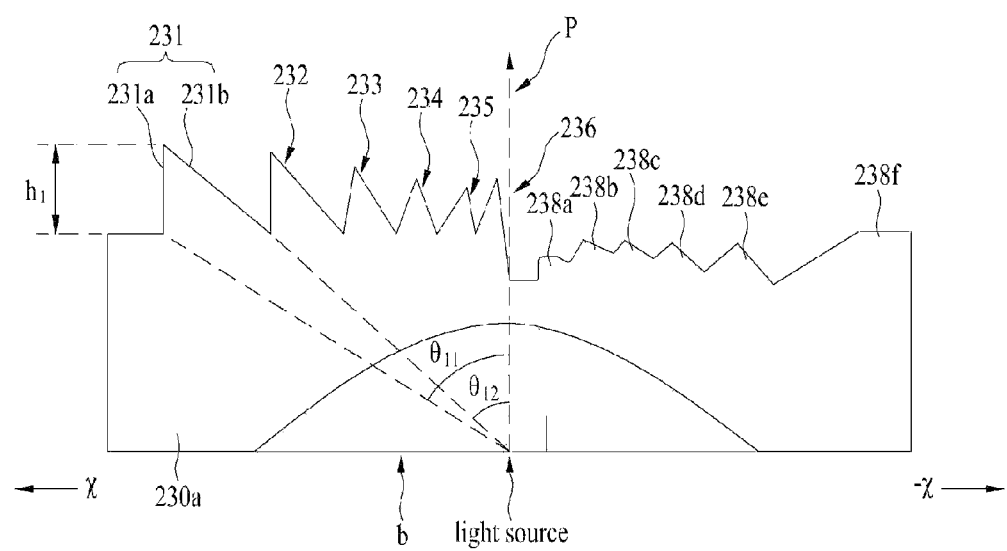

【FIG. 5b】
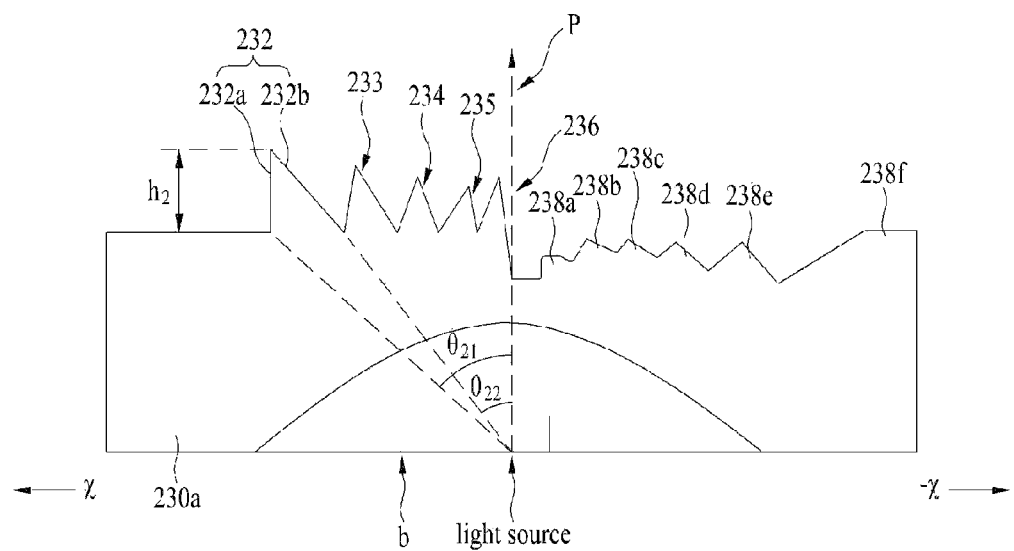
【FIG. 5c】
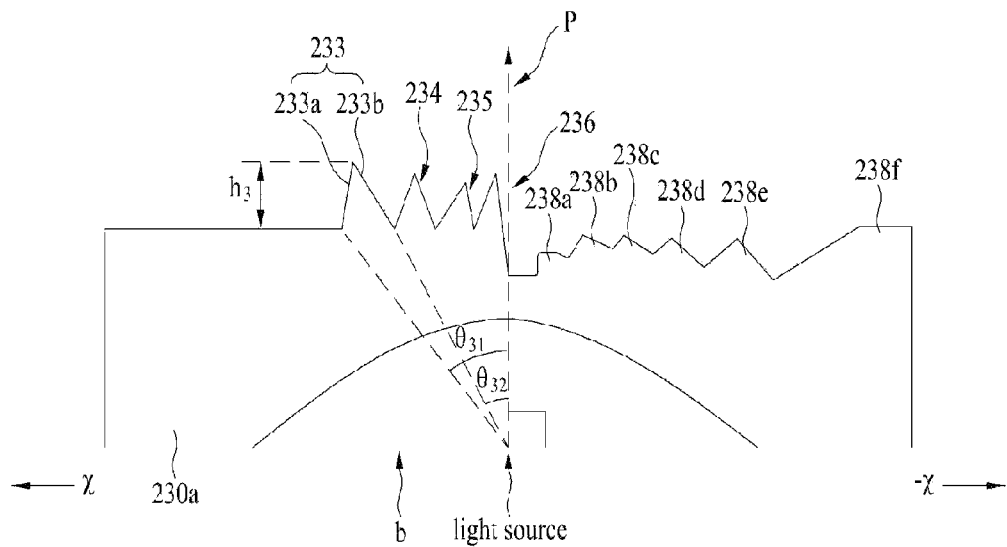

[FIG. 5d]
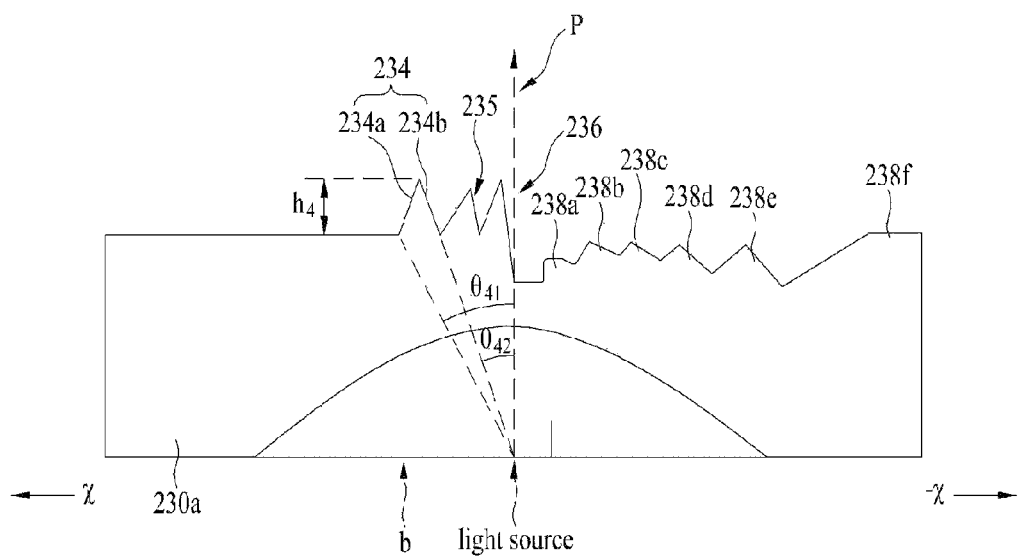
[FIG. 5e]
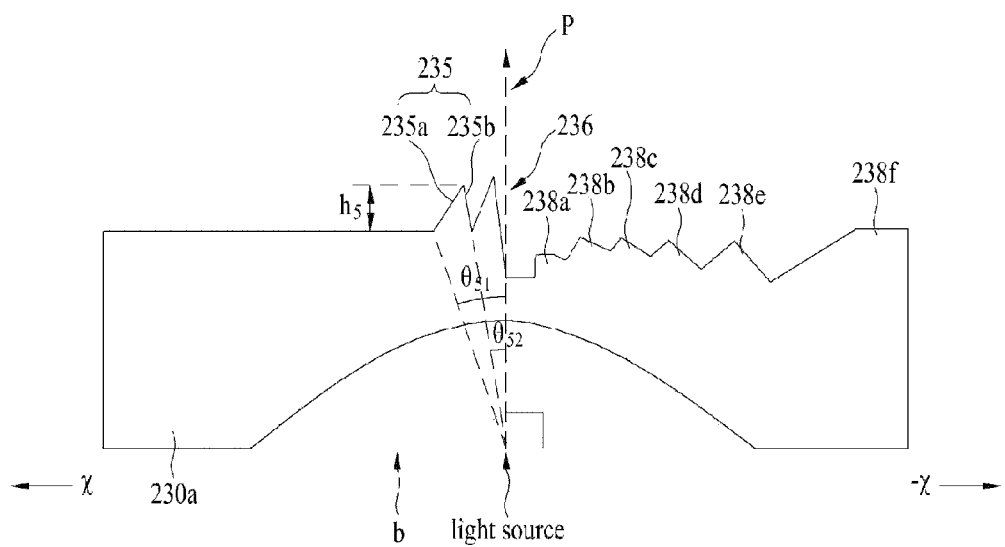

[FIG. 5f]
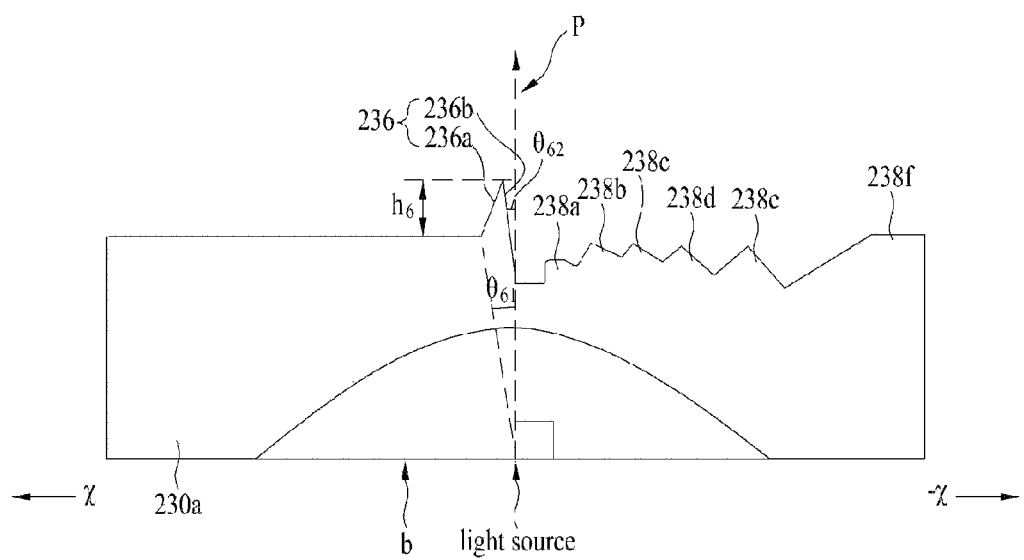
[FIG. 6]
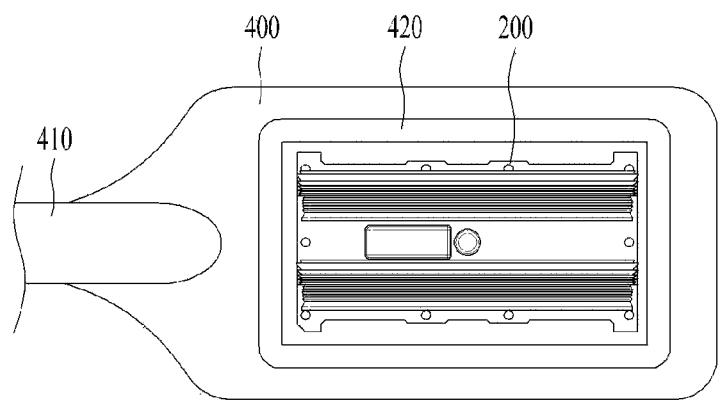

LENS AND LIGHT EMISSION UNIT INCLUDING THE SAME

CROSS REFERENCE TO RELATED APPLICATIONS

This application is the National Phase of PCT International Application No. PCT/KR2016/008094, filed on Jul. 25, 2016, which claims priority under 35 U.S.C. 119(a) to Patent Application No. 10-2015-0112895, filed in the Republic of Korea on Aug. 11, 2015, all of which are hereby expressly incorporated by reference into the present application.

TECHNICAL FIELD

Embodiments relate to a lens and a light emission unit including the same, and more particularly, to a light emission unit which emits a major quantity of light in one direction and a lighting apparatus including the same.

BACKGROUND ART

Group III-V compound semiconductor materials, such as GaN, AlGaN, etc., have many advantages, such as a wide and adjustable bandgap energy, and are thus widely used in optoelectronics and for electronic devices.

Particularly, light emitting devices, such as light emitting diodes (LEDs) or laser diodes (LDs), which use group III-V or II-VI compound semiconductor materials, are capable of emitting visible light of various colors, such as red, green and blue, and ultraviolet light owing to development of element materials and thin film growth techniques, are also capable of emitting white light with high luminous efficacy through use of phosphors or by combining colors, and have several advantages, namely low power consumption, semi-permanent lifespan, fast response speed, safety, and environmental friendliness, as compared to conventional light sources, such as fluorescent lamps and incandescent lamps.

Accordingly, application of the light emitting devices has been extended to transmission modules of optical communication means, light emitting diode backlights to replace Cold Cathode Fluorescent Lamps (CCFLs) which serve as backlights of Liquid Crystal Display (LCD) apparatuses, white light emitting diode lighting apparatuses to replace fluorescent lamps or incandescent lamps, vehicle head lamps, and traffic lights.

A molding unit protecting a light emitting structure or wires may be placed around a light emitting device, and light is refracted by the molding unit formed of a material, such as silicone, and thus the molding unit may function as a primary lens.

However, when the light emitting device is used a light source of a lighting apparatus, a secondary lens may be used to adjust a light emission path and the secondary lens is generally referred to as a 'lens'.

A light path may be greatly changed according to materials of the lens, particularly, shapes of the lens, and, particularly, in an application, such as a streetlamp which causes light emitted from a light source to travel only in a specific direction, i.e., a forward or backward direction, the shape of the lens is more important.

FIG. 1 is a perspective view illustrating a conventional lens.

In the conventional lens, a refraction unit 110 and a reflection unit 120 may be arranged so as to be spaced apart from each other, the refraction unit 110 may refract light emitted from a light emitting device, and the reflection unit 120 may reflect light traveling rightward in FIG. 1 so that the reflected light travels leftward in FIG. 1.

The lens having the above structure may concentrate traveling of light on a specific direction but, if a plurality of light emitting devices is placed in a lighting apparatus, such as a streetlamp, a plurality of lens must be placed, when light sources are arranged, the lenses must be moved according to the light sources and, in this case, distribution of light emitted from the lenses may be greatly changed according to movement of the light sources and the lenses.

DISCLOSURE

Technical Problem

Embodiments provide a lens which concentrates light, emitted to the outside, on one direction and scarcely changes distribution of light, emitted to the outside, according to movement of light sources, in a lighting apparatus having the light sources, such as light emitting devices.

Technical Solution

In one embodiment, a lens includes a lens body, a groove placed on one side of the lens body, a plurality of light path conversion units arranged on a first area of the surface of the lens body, opposite to the groove, and a plurality of refraction units arranged on a second area of the surface of the lens body, opposite to the groove, wherein the first area and the second area are arranged opposite each other with respect to the center of the surface of the lens body.

The light path conversion units and the refraction units may extend in one direction of the lens body so as to have the same shape.

The light path conversion units and the refraction units may be respectively arranged such that at least two light path conversion units are spaced apart from each other by a designated distance and at least two refraction units are spaced apart from each other by another designated distance.

Each of the light path conversion units may include a reflection part and a refraction part being adjacent to each other, and the reflection part and the refraction part of one light path conversion unit may have different angles of inclination.

In the light path conversion unit, an angle between a virtual line extending from a center of a lower portion of the lens to a center of an upper portion of the lens and a straight line connecting a light source to a lower end of the refraction part may be smaller than an angle between the virtual line and a straight line connecting the light source to a lower end of the reflection part.

The angle between the virtual line and the straight line connecting the light source to the lower end of the refraction part may be smaller than the angle between the virtual line and the straight line connecting the light source to the lower end of the reflection part by 8° to 12°.

Heights of highest points of the light path conversion units may be different.

The light path conversion units may include a first light path conversion unit located at an edge of the lens body to an $n^{th}$ light path conversion unit located adjacent to the center of the lens body, and a height of a highest point of the first light path conversion unit may be highest.

A height of a highest point of the $(n-1)^{th}$ light path conversion unit may be lowest.

The light path conversion units may include a first light path conversion unit located at an edge of the lens body to an $n^{th}$ light path conversion unit located adjacent to a center of the lens body, each of the light path conversion units may include reflection part and a refraction part, and, out of angles between a virtual line extending from a center of a lower portion of the lens to a center of an upper portion of the lens and straight lines connecting a light source to lower ends of the refraction parts of the respective light path conversion units, the angle between the virtual line and the straight line connecting the light source to the lower end of the refraction part of the first light path conversion unit may be greatest.

The light path conversion units may include a first light path conversion unit located at an edge of the lens body to an $n^{th}$ light path conversion unit located adjacent to a center of the lens body, each of the light path conversion units may include a reflection part and a refraction part, and, out of angles between a virtual line extending from a center of a lower portion of the lens to a center of an upper portion of the lens and straight lines connecting a light source to lower ends of the refraction parts of the respective light path conversion units, the angle between the virtual line and the straight line connecting the light source to the lower end of the refraction part of the $n^{th}$ first light path conversion unit may be smallest.

Heights of the refraction units may be lower than heights of points of lower ends of the respective light path conversion units meeting the lens body.

In another embodiment, a lens includes a lens body, a groove placed on one side of the lens body, a plurality of light path conversion units arranged on a first area of the surface of the lens body, opposite to the groove, and a plurality of refraction units arranged on a second area of the surface of the lens body, opposite to the groove, wherein each of the light path conversion units includes a reflection part and a refraction part being adjacent to each other, and the reflection part and the refraction part of one light path conversion unit have different angles of inclination.

In another embodiment, a light emission unit includes a body, a plurality of lenses arranged on an upper surface of the body, each lens including a lens body, a groove placed on one side of the lens body, a plurality of light path conversion units arranged on a first area of the surface of the lens body, opposite to the groove, and a plurality of refraction units arranged on a second area of the surface of the lens body, opposite to the groove, the first area and the second area being arranged opposite each other with respect to the center of the surface of the lens body, and a light source module, at least a part thereof being inserted into the groove formed at a lower portion of the lens, wherein the lenses are respectively arranged in a linear shape.

In each of the lenses, the light path conversion units may be arranged on the first area and the refraction units may be arranged on the second area with respect to the center of the surface of the lens body.

The groove may be arranged in a linear direction of the linear shape, and the light source module may be arranged so as to be movable in the linear direction within the groove.

Advantageous Effects

In a light emission unit and a lighting apparatus including the same in accordance with one embodiment, a quantity of light traveling in a second direction is much greater than a quantity of light traveling in a first direction and, if the lighting apparatus is used as a lighting apparatus for roads, the second direction serves as a direction toward a road and the first direction serves as a direction toward houses and, thus, a quantity of light reaching the houses may be reduced.

Further, a lens of a designated shape is arranged in one direction and, even if a light source is moved in the direction, output light may be uniformly maintained without redesign or rearrangement of the lens.

DESCRIPTION OF DRAWINGS

FIG. 1 is a perspective view illustrating a conventional lens.

FIG. 2A is a perspective view of a light emission unit in accordance with one embodiment.

FIG. 2B is a cross-sectional view of the light emission unit of FIG. 2A, taken along line I-I'.

FIG. 3 is a view illustrating one lens of FIG. 2B in more detail.

FIG. 4A is a view illustrating a light source module placed in the light emission unit in accordance with one embodiment.

FIG. 4B is a cross-sectional view of a light emitting device in accordance with one embodiment, shown in FIG. 4A.

FIGS. 5A to 5F are views illustrating the lens of FIG. 3 in more detail.

FIG. 6 is a view illustrating a lighting apparatus having a light emission unit in accordance with one embodiment.

BEST MODE

Hereinafter, embodiments will be described with reference to the annexed drawings and description.

In the following description of the embodiments, it will be understood that, when each element is referred to as being formed "on" or "under" another element, it can be directly "on" or "under" the other element or be indirectly formed with one or more intervening elements therebetween. Further, when an element is referred to as being formed "on" or "under" another element, not only the upward direction of the former element but also the downward direction of the former element may be included.

In addition, it will be understood that, although the relational terms "first", "second", "upper", "lower", etc. may be used herein to describe various elements, these terms neither require nor connote any physical or logical relations between substances or elements or the order thereof, and are used only to discriminate one substance or element from other substances or elements.

FIG. 2A is a perspective view of a light emission unit in accordance with one embodiment, and FIG. 2B is a cross-sectional view of the light emission unit of FIG. 2A, taken along line I-I'.

In a light emission unit 200 in accordance with this embodiment, two lenses 230 and 240 formed in a linear shape may be arranged on a body 210 opposite each other, two protrusions 220 and 250 may be arranged between the lenses 230 and 240, and a plurality of holes 260 may be placed at the edge of the body 210.

One protrusion 220 may be a region in which a driving unit, etc. of a lighting apparatus are arranged, another protrusion 250 may represent the center of the light emission unit 200, and the holes 260 may be regions into which screws may be inserted when the light emission unit 200 is fixed to the lighting apparatus.

The respective lenses 230 and 240 may be arranged so as to have the same shape in the above-described linear direction, and be spaced apart from each other by a designated distance.

FIG. 2B illustrates grooves extending from the body 210 to the lenses 230 and 240, the grooves on the body 210 are shown in a dotted line and the grooves on the lenses 230 and 240 are shown in a solid line.

FIG. 3 is a view illustrating one lens of FIG. 2B in more detail.

The lens 230 of FIG. 3 includes a lens body 230a, a groove placed on one side of the lens body 230a, light path conversion units 231~237 and refraction units 238a~238f arranged on the surface of the lens body 230a, opposite to the groove.

A lower surface of the lens body 230a on which the groove is formed may be referred to as a first surface, and an upper surface of the lens body 230a on which the light path conversion units 231~237 and the refraction units 238a~238f are formed may be referred to as a second surface.

The groove may be formed on the lower surface of the lens body 230a and extend to the body 210 of the light emission unit 200 and, as exemplarily shown in FIG. 2B, one groove may be continuously placed on both the body 210 and the lens body 230a and at least a part of a light emitting device, which will be described later, may be inserted into the groove.

As will be described later, the light path conversion units 231~237 are arranged in a first area, i.e., at the left side based on a virtual line extending from the center of the lower portion of the lens 230 to the center of the upper portion of the lens 230, the refraction units 238a~238f are arranged in a second area, i.e., at the right side based on the virtual line and, thus, the light path conversion units 231~238 and the refraction units 238a~238f may be arranged opposite each other with respect to the above virtual line. A thickness t1 of the lens body 230a may be greater than a height t2 of the groove, and a width w1 of the lens body 230a may be greater than a width w2 of the groove. Further, a height t0 of the lowest point of the light path conversion units 231~237 from the bottom surface of the lens body 230a may be smaller than the thickness t1 of the lens body 230a.

For example, the width w1 of the lens body 230a may be 16 mm to 20 mm, and the thickness t1 of the lens body 230a may be 4.0 mm to 5.0 mm.

The lens body 230a, the light path conversion units 231~237 and the refraction units 238a~238f forming the lens 230 may be formed of the same material, for example, polycarbonate.

In FIG. 3, the leftmost light path conversion unit 237 may be omitted and, in other drawings, the leftmost light path conversion unit 237 may be also omitted. Thereby, the volume of the light emission unit may be reduced.

FIG. 4A is a view illustrating a light source module placed in the light emission unit in accordance with one embodiment, and FIG. 4B is a cross-sectional view of a light emitting device in accordance with one embodiment, shown in FIG. 4A.

The light source module may include a circuit board and light emitting devices. The circuit board may employ a printed circuit board or a flexible circuit board.

The light emitting device may be a light emitting diode, for example, a vertical light emitting device, a horizontal light emitting device or a flip chip-type light emitting device, and FIG. 4B exemplarily illustrates a vertical light emitting device.

In the light emitting device 300, a junction layer 350, a reflective layer 340 and an ohmic layer 330 may be placed on a support substrate 360, a light emitting structure 320 may be placed on the ohmic layer 330, and a channel layer 370 may be placed at the edge of the lower surface of the light emitting structure 320.

The support substrate 360 may be a base substrate formed of at least one of copper (Cu), gold (Au), nickel (Ni), molybdenum (Mo) or copper-tungsten (Cu—W). Further, the support substrate 360 may be a carrier wafer formed of, for example, Si, Ge, GaAs, ZnO, SiC, SiGe, $Ga_2O_3$ or GaN.

The junction layer 350 may be placed on the support substrate 360. The junction layer 350 may bond the reflective layer 340 to the support substrate 360. The junction layer 350 may include, for example, at least one of Ti, Au, Sn, Ni, Cr, Ga, In, Bi, Cu, Ag or Ta.

The reflective layer 340 may be formed on the junction layer 350. The reflective layer 340 may be formed to have a monolayer structure or a multilayer structure using a material having excellent reflection characteristics, for example, one selected from the group consisting of silver (Ag), nickel (Ni), aluminum (Al), rubidium (Rh), palladium (Pd), iridium (Ir), ruthenium (Ru), magnesium (Mg), zinc (Zn), platinum (Pt), gold (Au), hafnium (Hf) and selective combinations thereof, or using the above metal and a light transmitting conductive material, such as IZO, IZTO, IAZO, IGZO, IGTO, AZO or ATO. Further, the reflective layer 340 may be formed to have a stacked structure, such as IZO/Ni, AZO/Ag, IZO/Ag/Ni or AZO/Ag/Ni, but the disclosure is not limited thereto.

The ohmic layer 330 may be formed on the reflective layer 340 and, in this case, the ohmic layer 330 may be in ohmic contact with the lower surface of the light emitting structure and be formed as a single layer or a plurality of patterns. The ohmic layer 330 may be formed selectively using a light-transmitting electrode layer and a metal. For example, the ohmic layer 330 may be formed to have a monolayer structure or a multilayer structure using one or more of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au and Ni/IrOx/Au/ITO.

The support substrate 360, the junction layer 350, the reflective layer 340 and the reflective layer 323 may form a first electrode and supply current to the light emitting structure.

The channel layer 370 may be placed between the first electrode and the light emitting structure. The channel layer 370 may be placed at the edge of the lower surface of the light emitting structure and be formed of a light transmitting material, for example, a metal oxide, a metal nitride, a light transmitting nitride, a light transmitting oxide or a light transmitting insulating layer. For example, the channel layer 370 may be formed selectively using indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, $TiO_2$, etc.

The light emitting structure 320 may be placed on the first electrode. The light emitting structure may include a first conductivity-type semiconductor layer 322, an active layer 324 and a second conductivity-type semiconductor layer 326.

The first conductivity-type semiconductor layer 322 may be formed of a compound semiconductor, i.e., a group III-V or group II-VI compound semiconductor, and be doped with a first conductivity-type dopant. For example, the first conductivity-type semiconductor layer 322 may be formed of a semiconductor material having an empirical formula of $Al_xIn_yGa_{1-x-y}N$ (0≤x≤1, 0≤y≤1, 0≤x+y≤1), i.e., one or more selected from the group consisting of AlGaN, GaN, InAlGaN, AlGaAs, GaP, GaAs, GaAsP and AlGaInP.

If the first conductivity-type semiconductor layer 322 is an n-type semiconductor layer, the first conductivity-type dopant may be an n-type dopant, such as Si, Ge, Sn, Se or Te. The first conductivity-type semiconductor layer 322 may be formed to have a monolayer structure or a multilayer structure, but the disclosure is not limited thereto.

The active layer 324 may be placed between the first conductivity-type semiconductor layer 322 and the second conductivity-type semiconductor layer 326, and include any one of a double hetero structure, a multi-well structure, a single quantum well structure, a multi quantum well (MQW) structure, a quantum wire structure and a quantum dot structure.

The active layer 324 may be formed of a group III-V compound semiconductor, have an empirical formula of $In_xAl_yGa_{1-x-y}N$ (0≤x≤1, 0≤y≤1, 0≤x+y≤1) and be formed to have one or more paired structures of well and barrier layers, for example, selected from the group consisting of AlGaN/AlGaN, InGaN/GaN, InGaN/InGaN, AlGaN/GaN, InAlGaN/GaN, GaAs(InGaAs)/AlGaAs and GaP(InGaP)/AlGaP, but the disclosure is not limited thereto.

The well layer may be formed of a material having a lower energy bandgap than the energy bandgap of the barrier layer.

The second conductivity-type semiconductor layer 326 may be formed of a compound semiconductor. The second conductivity-type semiconductor layer 326 may be formed of a group III-V or group II-VI compound semiconductor, and be doped with a second conductivity-type dopant. For example, the second conductivity-type semiconductor layer 326 may be formed of a semiconductor material having an empirical formula of $In_xAl_yGa_{1-x-y}N$ (0≤x≤1, 0≤y≤1, 0≤x+y≤1), i.e., one or more selected from the group consisting of AlGaN, GaNAlInN, AlGaAs, GaP, GaAs, GaAsP and AlGaInP.

If the second conductivity-type semiconductor layer 326 is a p-type semiconductor layer, the second conductivity-type dopant may be a p-type dopant, such as Mg, Zn, Ca, Sr or Ba. The second conductivity-type semiconductor layer 326 may be formed to have a monolayer structure or a multilayer structure, but the disclosure is not limited thereto.

Although not shown in the drawings, an electron blocking layer may be placed between the active layer 324 and the second conductivity-type semiconductor layer 326. The electron blocking layer may have a superlattice structure. For example, in the superlattice structure, an AlGaN layer doped with a second conductivity-type dopant may be placed and a plurality of GaN layers having different ratios of aluminum may be alternately placed, but the disclosure is not limited thereto.

A pattern, such as an uneven pattern, may be formed on the surface of the first conductivity-type semiconductor layer 326 and may thus improve light extraction efficiency, a second electrode 380 may be placed on the surface of the first conductivity-type semiconductor layer 326, and the pattern may be formed on the surface of the first conductivity-type semiconductor layer 326, on which the second electrode 380 is placed, as exemplarily shown in these figures, or no pattern may be formed thereon. The second electrode 380 may be formed to have a monolayer structure or a multilayer structure including at least one of aluminum (Al), titanium (Ti), chrome (Cr), nickel (Ni), copper (Cu) or gold (Au).

A current blocking layer 385 corresponding to the second electrode 380 may be placed under the light emitting structure, and the current blocking layer may be formed of an insulating material and uniformly supply current, supplied from a direction of the support substrate 360, throughout the entirety of the second conductivity-type semiconductor layer 326. The current blocking layer 385 may be placed in a region vertically overlapping the second electrode 380, but the disclosure is not limited thereto.

A passivation layer 390 may be formed around the light emitting structure. The passivation layer 390 may be formed of an insulating material, and the insulating material may include a nonconductive oxide or nitride. For example, the passivation layer 390 may include at least one of a silicon nitride ($SiO_2$) layer, an oxynitride layer or an aluminum oxide layer.

A light emitting module may be inserted into the above-described light emission unit and, in this case, at least a part of the light emitting module may be inserted into the groove of the light emission unit.

FIGS. 5A to 5F are views illustrating the lens of FIG. 3 in more detail.

In FIG. 5A, the groove may be formed on the lower surface, i.e., the first surface, of the lens body 230a, and the light path conversion units 231~236 and the refraction units 238a~238f may be formed on the upper surface, i.e., the second surface, of the lens body 230a and, herein, the leftmost light path conversion unit 237 of FIG. 3 may be omitted.

The light path conversion units 231~236 may be arranged at the left on the second surface, i.e., in the x direction, and the refraction units 238a~238f may be arranged at the right on the second surface, i.e., in the −x direction.

A point marked "light source" may be the center of a light emitting surface of the above-described light emitting device. A line marked "b" represents a lower portion of the groove, and the light source may be located on the line marked "b".

A dotted line P is a virtual line perpendicular to the line b representing the lower portion of the groove, and may serve to indicate angles of inclination of inclined surfaces of the light path conversion units 231~237, which will be described later.

Hereinafter, configuration of the light path conversion units 231~236 will be described, and the light path conversion units 231~236 may include reflection parts 231a~236b and thus perform reflection or total reflection of light emitted from the light source.

In FIG. 5A, the light path conversion unit 231 may include a reflection part 231a and a refraction part 231b, the reflection part 231a may totally reflect light, emitted from the light source and incident upon the reflection part 231a, so that the reflected light travels in the −x direction, and the refraction part 231b may refract light, emitted from the light source and incident upon the refraction part 231b, so that the refracted light travels in the −x direction.

The refraction part 231b may be parallel to a straight line connecting the light source to the lower end of the refraction part 231b. Further, an angle from the above-described virtual dotted line P to the reflection part 231a may be greater than an angle from the above-described virtual dotted line P to the refraction part 231b. For example, an angle θ11 between the virtual dotted line P and the surface of the reflection part 231a may be greater than an angle θ12 between the virtual dotted line P and the surface of the refraction part 231b.

For example, the above-described angle θ12 may be smaller than the angle θ11 by 8° to 12°, and the angles θ12 and θ11 may be respectively 50° and 60°.

An angle between the reflection part 231a and the refraction part 231b of the light path conversion unit 231 may be 8° to 12°, if such an angle is smaller than 8°, the light path conversion unit 231 has a small height of 1 mm or less and a sharp shape and may thus have difficulty in manufacture and, if such an angle is greater than 8°, a protruding part of the path conversion unit 231 has a large height and, thus, the light emission unit may have an increased volume and total reflection and refraction of light are not great and, thus, light may not be uniformly distributed in a light irradiation area. The above description of the angle between the reflection part 231a and the refraction part 231b of the light path conversion unit 231 may be applied to the light path conversion units 232~236 which will be described later.

The above-described angles θ11 and θ12 of the light path conversion unit 231 may be respectively 60° and 50°, and, as the light path conversion units 232~236 become closer to the center of the lens 230, corresponding angles θ21~θ61 and θ22~θ62 of the reflection parts 232a~236a and the refraction parts 232b~236b of the light path conversion units 232~236 may be gradually decreased, as will be described later.

Further, the above-described angles θ11 and θ12 of the light path conversion unit 231 may be respectively 60° and 50° and, corresponding angles θ21 and θ22 of the light path conversion unit 232 adjacent to the light path conversion unit 231 may be respectively 50° and 40° which are decreased from those of the light path conversion unit 231 by 10°, and the above-described angles θn1 and θn2 of the light path conversion units 231~236 may be gradually decreased from those of the adjacent light path conversion units by a difference of 8° to 12° in the central direction of the light emission unit.

The refraction units 238a~238f are arranged in a designated pattern on the second area, and light emitted from the light source and incident upon the respective refraction units 238a~238f may be refracted and the refracted light may travel in the −x direction.

FIG. 5B illustrates the structure of the light path conversion unit 232 adjacent to the light path conversion unit 231 described in detail with reference to FIG. 5A, in detail and, here, the light path conversion units 231 and 237 will be omitted for convenience of description and the configurations of other light path conversion units 231 and 233~236 and the refraction units 238a~238f may be the same as the configurations described with reference to FIG. 5A.

In FIG. 5B, the light path conversion unit 232 may include a reflection part 232a and a refraction part 232b, the reflection part 232a may totally reflect light, emitted from the light source and incident upon the reflection part 232a, so that the reflected light travels in the −x direction, and the refraction part 232b may refract, light emitted from the light source and incident upon the refraction part 232b, so that the refracted light travels in the −x direction.

The refraction part 232b may be parallel to a straight line connecting the light source to the lower end of the refraction part 232b. Further, an angle from the above-described virtual dotted line P to the reflection part 232a may be greater than an angle from the above-described virtual dotted line P to the refraction part 232b. For example, an angle θ21 between the virtual dotted line P and the surface of the reflection part 232a may be greater than an angle θ22 between the virtual dotted line P and the surface of the refraction part 232b. Here, the angle θ21 may be the same as the angle θ12 described above with reference to FIG. 5A. For example, the above-described angle θ22 may be smaller than the angle θ21 by 8° to 12°, and the angles θ22 and θ21 may be respectively 40° and 50°.

FIG. 5C illustrates the structure of the light path conversion unit 233 adjacent to the light path conversion unit 233 described in detail with reference to FIG. 5B, in detail and, here, the light path conversion units 231, 232 and 237 will be omitted for convenience of description and the configurations of other light path conversion units 231, 232 and 234~236 and the refraction units 238a~238f may be the same as the configurations described with reference to FIG. 5B.

In FIG. 5C, the light path conversion unit 233 may include a reflection part 233a and a refraction part 233b, the reflection part 233a may totally reflect light, emitted from the light source and incident upon the reflection part 233a, so that the reflected light travels in the −x direction, and the refraction part 233b may refract light, emitted from the light source and incident upon the refraction part 233b, so that the refracted light travels in the −x direction.

The refraction part 233b may be parallel to a straight line connecting the light source to the lower end of the refraction part 233b. Further, an angle from the above-described virtual dotted line P to the reflection part 233a may be greater than an angle from the above-described virtual dotted line P to the refraction part 233b. For example, an angle θ31 between the virtual dotted line P and the surface of the reflection part 233a may be greater than an angle θ32 between the virtual dotted line P and the surface of the refraction part 233b. Here, the angle θ31 may be the same as the angle θ22 described above with reference to FIG. 5A. For example, the above-described angle θ32 may be smaller than the angle θ31 by 8° to 12°, and the angles θ32 and θ31 may be respectively 30° and 40°.

FIG. 5D illustrates the structure of the light path conversion unit 234 adjacent to the light path conversion unit 233 described in detail with reference to FIG. 5C, in detail and, here, the light path conversion units 231~233 and 237 will be omitted for convenience of description and the configurations of other light path conversion units 231~233 and 235~236 and the refraction units 238a~238f may be the same as the configurations described with reference to FIG. 5C.

In FIG. 5D, the light path conversion unit 234 may include a reflection part 234a and a refraction part 234b, the reflection part 234a may totally reflect light, emitted from the light source and incident upon the reflection part 234a, so that the reflected light travels in the −x direction, and the refraction part 234b may refract light, emitted from the light source and incident upon the refraction part 234b, so that the refracted light travels in the −x direction.

The refraction part 234b may be parallel to a straight line connecting the light source to the lower end of the refraction part 234b. Further, an angle from the above-described virtual dotted line P to the reflection part 234a may be greater than an angle from the above-described virtual dotted line P to the refraction part 234b. For example, an angle θ41 between the virtual dotted line P and the surface of the reflection part 234a may be greater than an angle θ42 between the virtual dotted line P and the surface of the refraction part 234b.

Here, the angle θ41 of the reflection part may be the same as the angle θ32 described above with reference to FIG. 5C.

For example, the above-described angle θ42 may be smaller than the angle θ41 by 8° to 12°, and the angles θ42 and θ41 may be respectively 20° and 30°.

FIG. 5E illustrates the structure of the light path conversion unit 235 adjacent to the light path conversion unit 234 described in detail with reference to FIG. 5D, in detail and, here, the light path conversion units 231~234 and 237 will be omitted for convenience of description and the configurations of other light path conversion units 231~234 and 236 and the refraction units 238a~238f may be the same as the configurations described with reference to FIG. 5D.

In FIG. 5E, the light path conversion unit 235 may include a reflection part 235a and a refraction part 235b, the reflection part 235a may totally reflect light, emitted from the light source and incident upon the reflection part 235a, so that the reflected light travels in the −x direction, and the refraction part 235b may refract light, emitted from the light source and incident upon the refraction part 235b, so that the refracted light travels in the −x direction.

The refraction part 235b may be parallel to a straight line connecting the light source to the lower end of the refraction part 235b. Further, an angle from the above-described virtual dotted line P to the reflection part 235a may be greater than an angle from the above-described virtual dotted line P to the refraction part 235b. For example, an angle θ51 between the virtual dotted line P and the surface of the reflection part 235a may be greater than an angle θ52 between the virtual dotted line P and the surface of the refraction part 235b.

Here, the angle θ51 of the reflection part may be the same as the angle θ42 described above with reference to FIG. 5D.

For example, the above-described angle θ52 may be smaller than the angle θ41 by 8° to 12°, and the angles θ52 and θ51 may be respectively 10° and 20°.

FIG. 5F illustrates the structure of the light path conversion unit 236 adjacent to the light path conversion unit 235 described in detail with reference to FIG. 5E, in detail and, here, the light path conversion units 231~235 and 237 will be omitted for convenience of description and the configurations of other light path conversion units 231~235 and the refraction units 238a~238f may be the same as the configurations described with reference to FIG. 5D.

In FIG. 5F, the light path conversion unit 236 may include a reflection part 236a and a refraction part 236b, the reflection part 236a may totally reflect light, emitted from the light source and incident upon the reflection part 236a, so that the reflected light travels in the −x direction, and the refraction part 236b may refract light, emitted from the light source and incident upon the refraction part 236b, so that the refracted light travels in the −x direction.

The refraction part 235b may be parallel to a straight line connecting the light source to the lower end of the refraction part 235b, i.e., the above-described virtual dotted line P. Further, an angle θ61 between the above-described dotted line P and a straight line connecting the light source to the lower end of the reflection part 236a may be the same as the angle θ52 described above with reference to FIG. 5E.

For example, the above-described angle θ52 may be 10°.

Further, FIGS. 5A to 5F illustrate heights h1-h6 of the respective light path conversion units 231~236, and the heights h1-h6 of the light path conversion units 231~236 may satisfy, for example, a relational expression of h1>h2>h3>h4>h6>h5.

In FIG. 5E, the height h5 of the light path conversion unit 235 may be, for example, 1 mm.

That is, if the light path conversion units 231~236 include a first light path conversion unit 231 located at the edge of the lens body 230a to an $n^{th}$ light path conversion unit 236 adjacent to the center of the lens body 230a, the height of the highest point of the first light path conversion unit 231 may be greatest and the height of the highest point of the $(n-1)^{th}$ light path conversion unit 236 may be smallest.

The above height relations of the light path conversion units 231~236 may be varied according angles between the reflection parts 231a-236a and the refraction parts 231b-236b of the respective light path conversion units 231~236.

Further, with reference to FIGS. 5A to 5F, the heights of the highest points of the refraction units 238a~238e may be lower than the heights of the lowest points of the respective light path conversion units 231~236.

A light source module including light emitting devices may be inserted into the above-described light emission unit and thus form a light source unit. Further, the light source module may be freely arranged in the groove, formed on the lower portion of the light emission unit in a linear shape, in the above-described linear direction. Conventionally, when arrangement of a light source module is changed, a lens corresponding thereto must be newly designed and manufactured, but, in the above-described embodiment, a light source module is arranged in the linear direction of a lens forming a light emission unit and, even if the position of the light source module is changed, output light may be regularly maintained without redesign or rearrangement of the lens.

FIG. 6 is a view illustrating a lighting apparatus in accordance with one embodiment, in which the above-described light emission unit is placed.

Here, a light source provided in a lighting apparatus for roads is illustrated, a recess 420 is formed on a housing 400, and a light emission unit 200 is placed in the recess 420. The shape of the recess 420 is not limited to the illustration, and a connector 410 may be provided on one surface of the housing 400 so that power from the outside may be supplied to the light emission unit 200 or a support member (not shown) supporting the housing 400 is connected to the housing 400 through the connector 410.

In FIG. 6, an upward direction may be a direction toward houses, and a downward direction may be a direction toward a road.

In the lighting apparatus in accordance with this embodiment, even if the position of a light source module, such as a light emitting device, in a light source unit is changed, the shape of lenses forming the light emission unit is constant and thus, output light is uniformly maintained without redesign or rearrangement of the lenses. Further, light may be transferred only in one direction by the above-described effect of light path conversion units of the lenses and, if the lighting apparatus is used as a streetlamp, light may be transferred only in the direction toward the road and a quantity of light transferred in the direction toward the houses may be reduced or eliminated.

The lighting apparatus of FIG. 6 may be used as a security light and a lighting apparatus in other fields in addition to a streetlamp at a roadside.

Although embodiments have been described with reference to a number of illustrative embodiments thereof, it should be understood that numerous other modifications and embodiments can be devised by those skilled in the art that will fall within the spirit and scope of the principles of the disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A light emission unit and a lighting apparatus including the same in accordance with one embodiment may be used as a streetlamp.

The invention claimed is:

1. A lens comprising:
a lens body;
a groove placed on one side of the lens body;
a plurality of light path conversion units arranged on a first area of a surface of the lens body, opposite to the groove; and
a plurality of refraction units arranged on a second area of the surface of the lens body, opposite to the groove,
wherein the first area and the second area are arranged opposite each other with respect to a center of the surface of the lens body,
wherein each of the light path conversion units comprises a reflection part and a refraction part being adjacent to each other,
wherein the reflection part and the refraction part of the light path conversion units have different angles of inclination between the reflection part and the refraction part, and
wherein the angle of inclination between the reflection part and the refraction part becomes smaller as the light path conversion units become closer to the center of the surface of the lens body.

2. The lens according to claim 1, wherein the light path conversion units and the refraction units extend in one direction of the lens body so as to have the same shape.

3. The lens according to claim 2, wherein the light path conversion units and the refraction units are respectively arranged such that at least two light path conversion units are spaced apart from each other by a designated distance and at least two refraction units are spaced apart from each other by another designated distance.

4. The lens according to claim 1, wherein, in the light path conversion unit, an angle between a virtual line extending from a center of a lower portion of the lens to a center of an upper portion of the lens and a straight line connecting a light source to a lower end of the refraction part is smaller than an angle between the virtual line and a straight line connecting the light source to a lower end of the reflection part.

5. The lens according to claim 4, wherein the angle between the virtual line and the straight line connecting the light source to the lower end of the refraction part is smaller than the angle between the virtual line and the straight line connecting the light source to the lower end of the reflection part by 8° to 12°.

6. The lens according to claim 1, wherein heights of highest points of the light path conversion units are different.

7. The lens according to claim 1, wherein the light path conversion units comprise a first light path conversion unit located at an edge of the lens body to an $n^{th}$ light path conversion unit located adjacent to the center of the surface of the lens body, and
wherein a height of a highest point of the first light path conversion unit is highest.

8. The lens according to claim 7, wherein a height of a highest point of an $(n-1)^{th}$ light path conversion unit is lowest.

9. The lens according to claim 1, wherein the light path conversion units comprise a first light path conversion unit located at an edge of the lens body to an $n^{th}$ light path conversion unit located adjacent to a to the center of the surface of the lens body, and wherein:
out of angles between a virtual line extending from a center of a lower portion of the lens to a center of an upper portion of the lens and straight lines connecting a light source to lower ends of the refraction parts of the respective light path conversion units, an angle between the virtual line and the straight line connecting the light source to the lower end of the refraction part of the first light path conversion unit is greatest.

10. The lens according to claim 1, wherein the light path conversion units comprise a first light path conversion unit located at an edge of the lens body to an $n^{th}$ light path conversion unit located adjacent to the center of the surface of the lens body, and wherein:
out of angles between a virtual line extending from a center of a lower portion of the lens to a center of an upper portion of the lens and straight lines connecting a light source to lower ends of the refraction parts of the respective light path conversion units, an angle between the virtual line and the straight line connecting the light source to the lower end of the refraction part of the $n^{th}$ first light path conversion unit is smallest.

11. The lens according to claim 1, wherein heights of the refraction units are lower than heights of points of lower ends of the respective light path conversion units meeting the lens body.

12. The light emission unit according to claim 1, wherein each of the refraction units includes predetermined pattern and are disposed on the second area.

13. A lens comprising:
a lens body;
a groove placed on one side of the lens body;
a plurality of light path conversion units arranged on a first area of a surface of the lens body, opposite to the groove; and
a plurality of refraction units arranged on a second area of the surface of the lens body, opposite to the groove,
wherein each of the light path conversion units comprises a reflection part and a refraction part being adjacent to each other, and the reflection part and the refraction part of the light path conversion units have different angles of inclination between the reflection part and the refraction part, and
wherein the angle of inclination between the reflection part and the refraction part becomes smaller as the light path conversion units become closer to a center of the lens body.

14. The lens according to claim 13, wherein, in the light path conversion unit, an angle between a virtual line extending from a center of a lower portion of the lens to a center of an upper portion of the lens and a straight line connecting a light source to a lower end of the refraction part is smaller than an angle between the virtual line and a straight line connecting the light source to a lower end of the reflection part.

15. The lens according to claim 14, wherein the angle between the virtual line and the straight line connecting the light source to the lower end of the refraction part is smaller than the angle between the virtual line and the straight line connecting the light source to the lower end of the reflection part by 8° to 12°.

16. The lens according to claim 13, wherein heights of highest points of the light path conversion units are different.

17. The lens according to claim 13, wherein the light path conversion units comprise a first light path conversion unit located at an edge of the lens body to an $n^{th}$ light path conversion unit located adjacent to the center of the lens body, and wherein a height of a highest point of the first light path conversion unit is highest, and a height of a highest point of an $(n-1)^{th}$ light path conversion unit is lowest.

18. A light emission unit comprising:

a body;

a plurality of lenses arranged on an upper surface of the body, each lens comprising a lens body, a groove placed on one side of the lens body, a plurality of light path conversion units arranged on a first area of the surface of the lens body, opposite to the groove, and a plurality of refraction units arranged on a second area of the surface of the lens body, opposite to the groove, the first area and the second area being arranged opposite each other with respect to a center of the surface of the lens body; and a light source module, at least a part thereof being inserted into the groove formed at a lower portion of the lens, wherein the lenses are respectively arranged in a linear shape, and wherein an angle between the reflection part and the refraction part becomes smaller as the light path conversion units become closer to the center of the surface of the lens body.

19. The light emission unit according to claim 18, wherein, in each of the lenses, the light path conversion units are arranged on the first area and the refraction units are arranged on the second area with respect to the center of the surface of the lens body.

* * * * *